United States Patent
Ito

(10) Patent No.: US 8,501,058 B2
(45) Date of Patent: Aug. 6, 2013

(54) METHOD OF CLEANING TEMPLATE AND PATTERN FORMING METHOD

(75) Inventor: Shinichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/541,249

(22) Filed: Aug. 14, 2009

(65) Prior Publication Data

US 2010/0044921 A1 Feb. 25, 2010

(30) Foreign Application Priority Data

Aug. 21, 2008 (JP) ................ P2008-213354

(51) Int. Cl.
*B29B 7/04* (2006.01)

(52) U.S. Cl.
USPC ................. 264/39; 264/293; 425/385

(58) Field of Classification Search
USPC ..................... 264/293, 39; 425/385
See application file for complete search history.

(56) References Cited

U.S. PATENT DOCUMENTS

| | | | |
|---|---|---|---|
| 5,888,312 A * | 3/1999 | Inada et al. | 134/11 |
| 6,440,647 B1 * | 8/2002 | Yakobson | 430/329 |
| 7,364,839 B2 * | 4/2008 | Hayasaki et al. | 430/322 |
| 7,832,416 B2 * | 11/2010 | Wang et al. | 134/61 |
| 2003/0219660 A1 | 11/2003 | Ito et al. | |
| 2004/0131980 A1 | 7/2004 | Hayasaki et al. | |
| 2006/0154179 A1 | 7/2006 | Van Santen et al. | |
| 2006/0198917 A1 * | 9/2006 | Ho et al. | 425/174.4 |
| 2006/0275674 A1 * | 12/2006 | Kim | 430/5 |
| 2009/0146347 A1 * | 6/2009 | Kruijt-Stegeman et al. | 264/571 |

FOREIGN PATENT DOCUMENTS

| | | | |
|---|---|---|---|
| JP | 10270311 A | * | 10/1998 |
| JP | 2004-363444 | | 12/2004 |
| JP | 2005-327788 | | 11/2005 |
| JP | 2006-32992 | | 2/2006 |
| JP | 2006-186111 | | 7/2006 |
| JP | 2008-098633 | | 4/2008 |

OTHER PUBLICATIONS

Notification of Reasons for Refusal received from the Japanese Patent Office in corresponding Japanese Patent Application No. 2008-213354, dated Nov. 12, 2010.

* cited by examiner

*Primary Examiner* — Amjad Abraham
(74) *Attorney, Agent, or Firm* — Finnegan, Henderson, Farabow, Garrett & Dunner, L.L.P.

(57) ABSTRACT

To remove the resist residue on a template by holding the template with a pattern face having irregularities, supplying a cleaning agent to an area containing the contamination adhering to the pattern face of the template, applying emitted light from the opposite face of the pattern face of the template, and optically exciting the cleaning agent with the emitted light to produce a radical, making at least part of the contamination hydrophilic by reaction of the contamination with the radical, and removing the contamination from the template after hydrophilization.

15 Claims, 7 Drawing Sheets

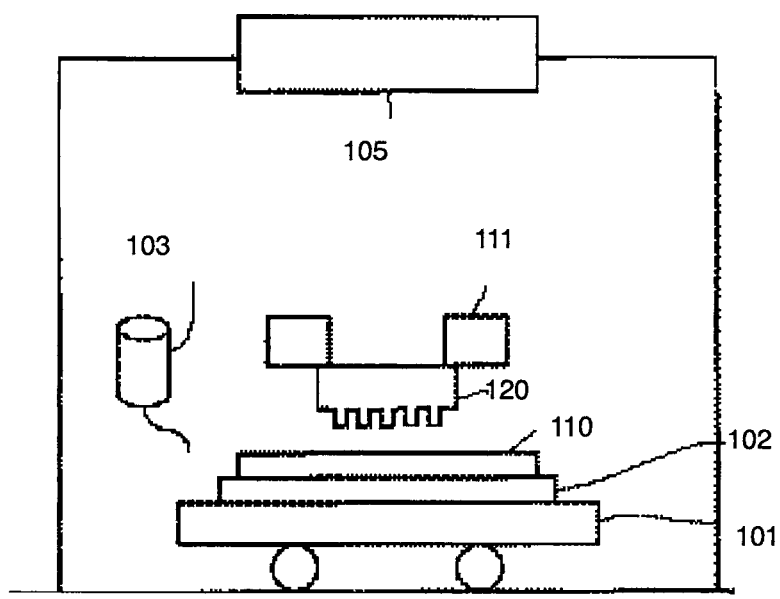

Fig.6A
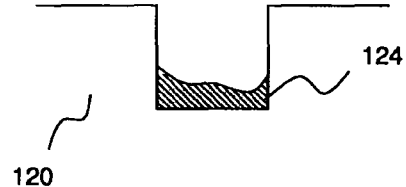
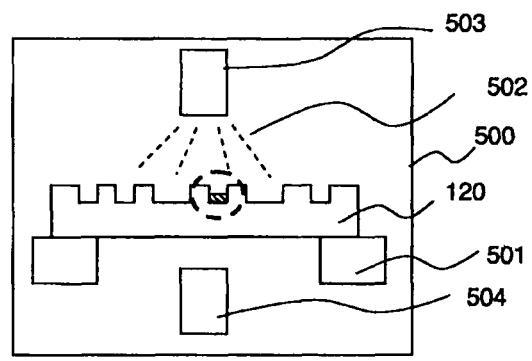
Fig.6B
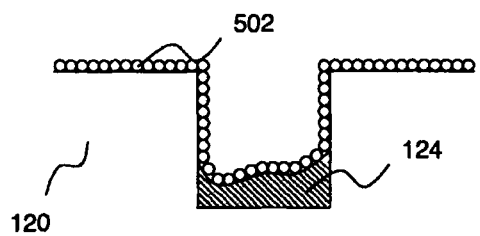
Fig.6C
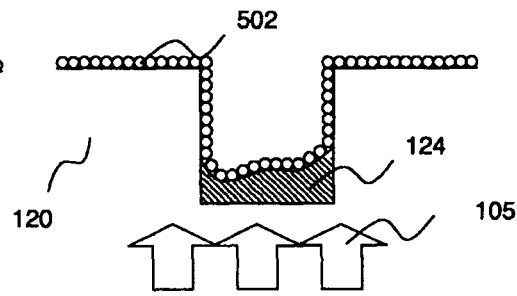
Fig.6D
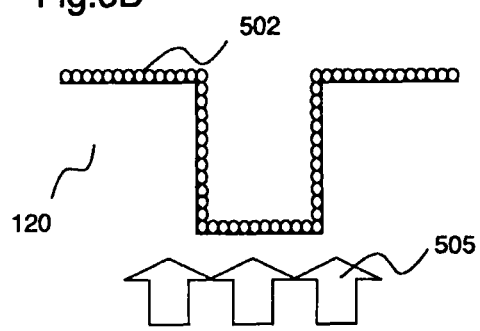
Fig.6E
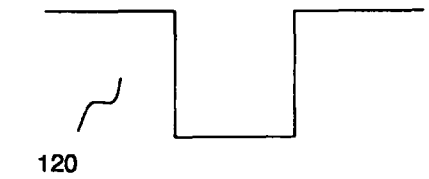

METHOD OF CLEANING TEMPLATE AND PATTERN FORMING METHOD

CROSS-REFERENCE TO RELATED APPLICATION

This application claims the benefit of priority from Japanese Patent Application No. 2008-213354, filed on Aug. 21, 2008, the entire contents of which are incorporated herein by reference.

BACKGROUND OF THE INVENTION

1. Field of the Invention

The present invention relates to a method of cleaning a template applied in imprint lithography and a pattern forming method using the template cleaned by the cleaning method.

2. Description of the Related Art

In recent years, a nanoimprint lithography has gained attention as a method of forming the micro-pattern. With the nanoimprint lithography, a resist pattern is formed by placing an imprint template formed with an a concavo-convex pattern in contact with a resist coated on the to-be-processed substrate and peeling the template from the resist after hardening the resist.

In releasing the template, part of the resist pattern is cut off, so that the resist may remain on the pattern face of the template in some cases. Therefore, in forming the pattern by the imprint lithography, it is required to appropriately remove the resist remaining on the template.

A method for removing the resist remaining on the template is described in patent document 1. Patent document 1 discloses a method in which a photo-catalyst such as titanium oxide is preformed on the pattern surface of the template, and when the resist residue occurs, ultraviolet ray is applied from the pattern face to oxidize and decompose the resist residue using the photo-catalyst action of titanium oxide and remove it, as shown in FIG. 3B of patent document 1. However, when titanium oxide is formed on the template, it is typically required to bake at a temperature of 500° or above, resulting in a problem that the pattern of the template is distorted, whereby this method is difficult in practice.

Also, a method for using the OH radical in order to make the resist surface hydrophilic is described in patent document 2. Patent documents 3 and 4 disclose a method in which the ultraviolet ray is applied to the resist pattern on the to-be-processed substrate from the side of the pattern face in the atmosphere containing water or oxygen to generate an OH radical or oxygen radical and remove part of the resist pattern using them to make the resist pattern slender.

[Patent document 1] JP-A-2005-327788
[Patent document 2] JP-A-2006-186111
[Patent document 3] JP-A-2006-32992
[Patent document 4] JP-A-2004-363444

BRIEF SUMMARY OF THE INVENTION

A method of cleaning a template according to an embodiment of the present invention comprises, holding a template with a concavo-convex pattern face having contamination area, supplying a cleaning agent to an contamination area of the pattern face of said template, where contamination is adhered, applying emitted light to the contamination area from the opposite face of said pattern face of said template, and optically exciting said cleaning agent with said emitted light to produce a radical, making said contamination hydrophilic by reaction of said contamination with said radical, and removing said contamination from said template after said hydrophilic treatment.

A pattern forming method according to an embodiment of the present invention comprises holding a template with a concavo-convex pattern face having contamination area, supplying a cleaning agent to an contamination area of the pattern face of said template, where contamination is adhered, applying emitted light to the contamination area from the opposite face of said pattern face of said template, and optically exciting said cleaning agent with said emitted light to produce a radical, making said contamination hydrophilic by reaction of said contamination with said radical, removing said contamination from said template after said hydrophilic treatment, coating an imprint material on a to-be-processed substrate, placing the pattern face of said template in contact with said imprint material after removing said contamination from said template, hardening said imprint material in a state where said template is kept in contact with said imprint material, and releasing said template from said imprint material.

BRIEF DESCRIPTION OF THE DRAWINGS

FIG. 1 is a schematic view of a nanoimprint apparatus according to a first embodiment of the present invention.

FIG. 6A is a cross-sectional view of a process showing a pattern forming method using the nanoimprint lithography according to a fourth embodiment of the invention.

FIG. 6B is a cross-sectional view of a process showing the pattern forming method using the nanoimprint lithography according to the fourth embodiment of the invention.

FIG. 6C is a cross-sectional view of a process showing the pattern forming method using the nanoimprint lithography according to the fourth embodiment of the invention.

FIG. 6D is a cross-sectional view of a process showing the pattern forming method using the nanoimprint lithography according to the fourth embodiment of the invention.

FIG. 6E is a cross-sectional view of a process showing the pattern forming method using the nanoimprint lithography according to the fourth embodiment of the invention.

DETAILED DESCRIPTION OF THE INVENTION

Figure 2A:
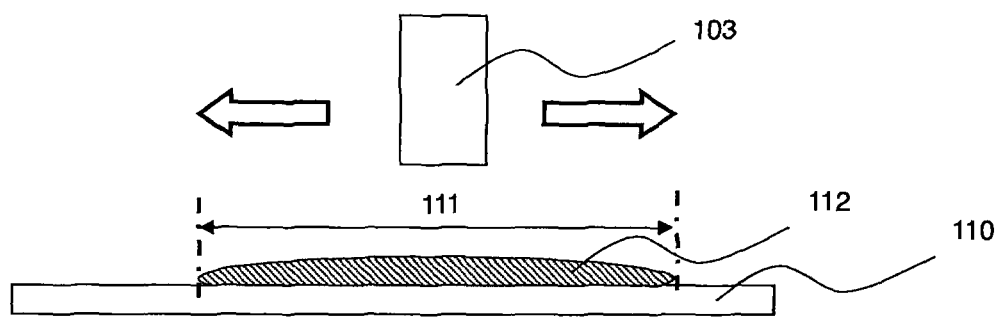
FIG. 2A is a cross-sectional view of a process showing a pattern forming method using the nanoimprint lithography according to the first embodiment of the invention.

Exemplary embodiments of the present invention are explained in detail below. The present invention is not limited by the embodiments.

(First Embodiment)

An optical nanoimprint apparatus and a pattern forming method with the optical nanoimprint lithography using the apparatus according to a first embodiment of the invention will be described below with reference to FIGS. 1 and 2.

FIG. 1 is a schematic view showing one example of the nanoimprint apparatus 100 for use with the imprint lithography using optical hardening. The nanoimprint apparatus 100 comprises a chuck 102 for securing a to-be-processed substrate (wafer) 110, a stage for a substrate to be processed 101 for placing the to-be-processed substrate thereon and moving it in two dimensions, an imprint resist coating unit 103 for selectively supplying a resist material onto the to-be-processed substrate, a template holding chuck 104 for holding a nanoimprint template 120, and a UV lamp 105 for making UV radiation to harden the resist material via the template. The nanoimprint template 120 is a transparent quartz substrate useful for the typical photo-mask on which an concavo-convex pattern is formed by plasma etching, for example.

FIG. 2 shows one example of a pattern forming process with the typical nanoimprint lithography using this apparatus 100. FIG. 2 is a cross-sectional view of a process showing the pattern forming method with the typical nanoimprint lithography.

First of all, after the to-be-processed substrate 110 was held by the chuck, the to-be-processed substrate 110 was relatively moved under the imprint resist coating unit 103, whereby a fluid imprint resist 112 was selectively formed on a to-be-imprinted area 111 of the to-be-processed substrate 110, as shown in FIG. 2A. The resist 112 was coated by operating the imprint resist coating unit 103.

Figure 2B:
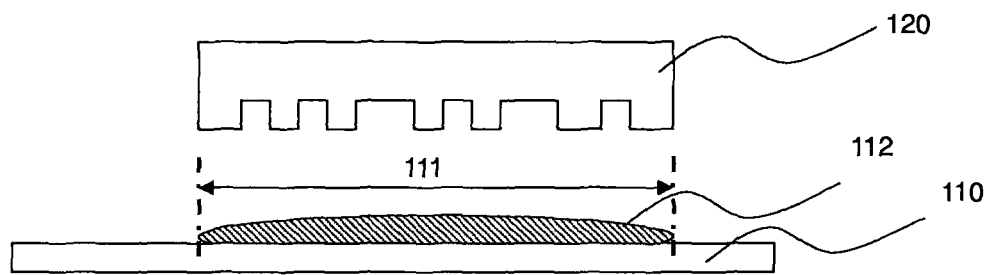
FIG. 2B is a cross-sectional view of a process showing the pattern forming method using the nanoimprint lithography according to the first embodiment of the invention.

Next, the to-be-processed substrate 110 was moved directly under the template 120 held on the template holding chuck by driving the stage for a substrate to be processed, as shown in FIG. 2B.

Figure 2C:
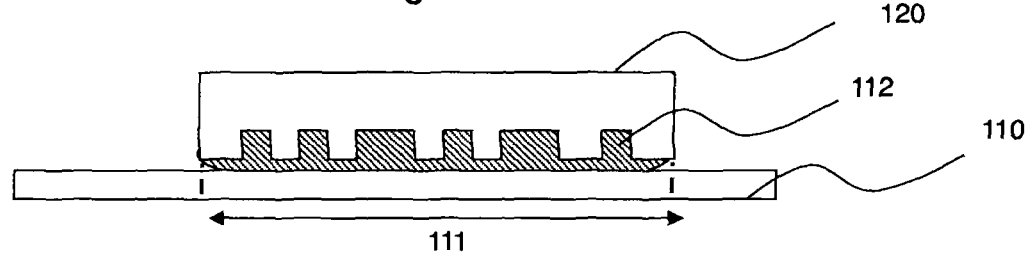
FIG. 2C is a cross-sectional view of a process showing the pattern forming method using the nanoimprint lithography according to the first embodiment of the invention.

Subsequently, the concavo-convex pattern face of the template 120 was placed in proximity to the principal plane of the to-be-processed substrate 110 to sandwich the resist 112, and brought into contact with the resist 112, as shown in FIG. 2C. At this time, the resist 112 is filled in a concave region of the template owing to a capillary phenomenon.

Figure 2D:
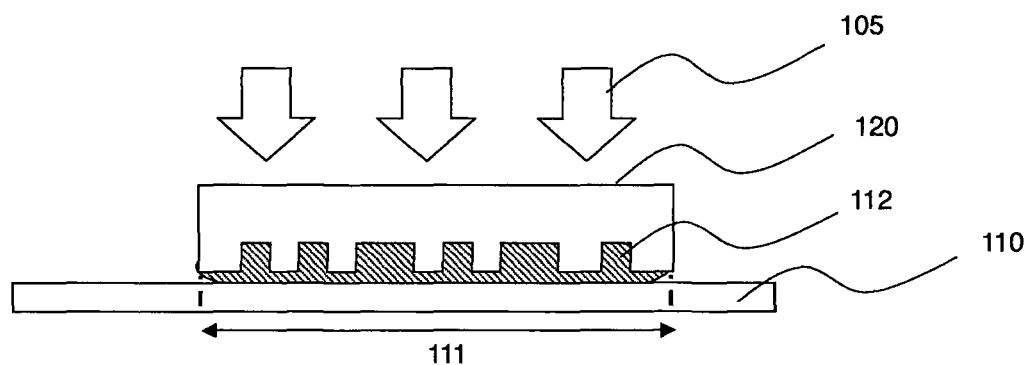
FIG. 2D is a cross-sectional view of a process showing the pattern forming method using the nanoimprint lithography according to the first embodiment of the invention.

After filling, after making the alignment between the to-be-processed substrate 110 and the pattern formed on template 120 was made, the light irradiation 105 was applied from the opposite face of the pattern formation face (concavo-convex plane) of the template 120 to harden the resist, as shown in FIG. 2D.

Figure 2E:
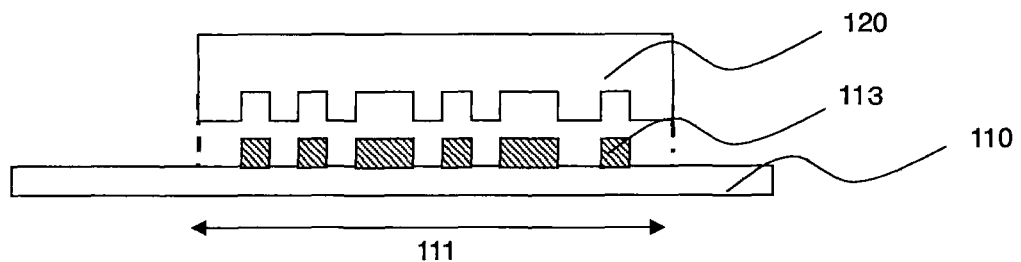
FIG. 2E is a cross-sectional view of a process showing the pattern forming method using the nanoimprint lithography according to the first embodiment of the invention.

Further, after hardening the resist 112, a resist pattern 113 was formed on the to-be-processed substrate 110 by releasing the template 120, as shown in FIG. 2E.

Figure 3:
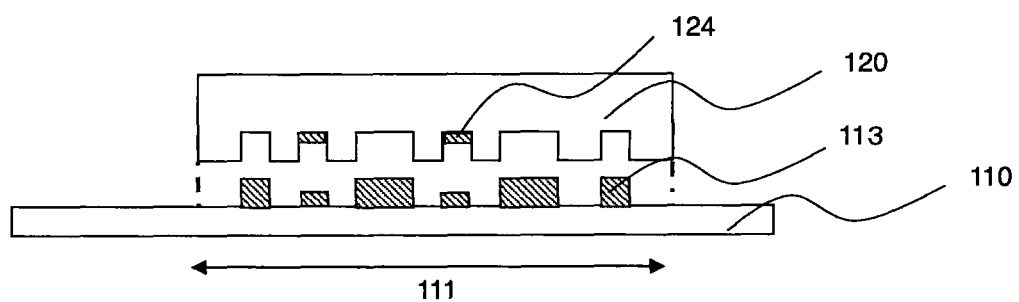
FIG. 3 is a cross-sectional view of a template showing resist residue arising when using the nanoimprint lithography.
Figure 4:
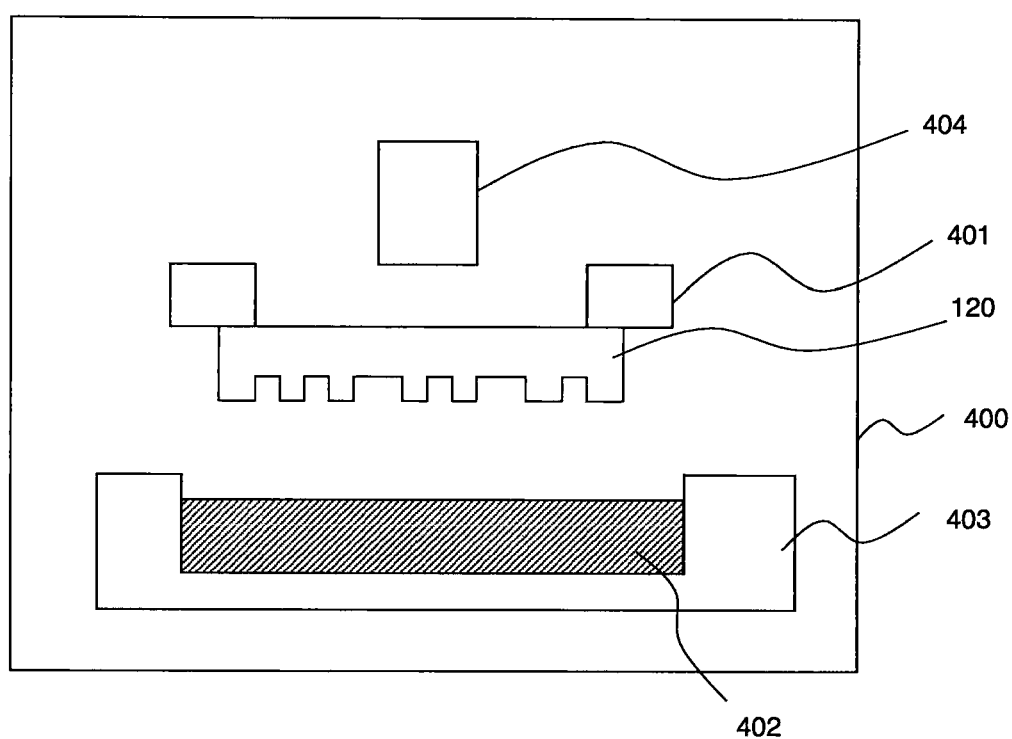
FIG. 4 is a schematic view showing a cleaning apparatus for the template according to the first embodiment of the invention.

However, contamination like a residual resist 124 may occurs in the concave pattern of the template 120 in some cases, because the resist pattern 113 is torn off in releasing the template 120, as shown in FIG. 3. If the template continues to be used in this state, a common defect occurs on the resist pattern, whereby it is required to perform a cleaning process for removing the resist 124 remaining in the concave portion of the template. Referring to FIG. 4, one example of a cleaning apparatus for use in cleaning the template according to this embodiment will be described below. FIG. 4 is a schematic view showing the cleaning apparatus for use in cleaning the template according to the embodiment.

The cleaning apparatus 400 according to the embodiment comprises a template holding chuck 401 for holding the template 120 of cleaning object, a cleaning agent supply unit 403 for supplying a cleaning agent 402 onto the pattern formation face of the template 120, and a light irradiation unit 404 for applying light to the cleaning agent 402 to activate it, as shown in FIG. 4.

As the cleaning agent supply unit 403, a cleaning bath for soaking the pattern face of the template 120 was employed. The cleaning agent is supplied to the cleaning bath through a pipe (not shown). The cleaning agent supply unit 403 is not limited to the above cleaning bath, but may be any means as far as it can supply the cleaning agent onto the pattern face of the template 120. Another example of the cleaning agent supply unit will be described later.

As the cleaning agent 402, an oxygen water was employed. The oxygen water is one in which oxygen gas is dissolved in the degassed pure water. The cleaning agent 402 is not limited to this oxygen water, but may be any agent as far as it produces at least OH radical due to light irradiation. For example, the cleaning agent may be water or an aqueous solution with water as the solvent, a solution with hydrogen peroxide water as the solute, organic substance or alcohol.

The template holding chuck 401 holds the pattern face of the template 120 in the direction in which the cleaning agent 402 is supplied. The template holding chuck 401 can drive or tilt the held template 120 in the plane direction and the vertical direction, drive the pattern face of the template 120 toward the cleaning agent 401 reserved in the cleaning bath, and supply the cleaning agent 402 in contact with the pattern face.

The light irradiation unit 404 has an Xe excimer lamp as a light source. A light having a wavelength of 172 nm from the Xe excimer lamp is applied to the template 120. The light irradiation unit 404 according to this embodiment is provided at the position nearer to the opposite face of the pattern face than the pattern face so that the light may be applied from the opposite face of the pattern face of the template 120. Also, the light irradiation unit 404 can be driven in the plane direction and the vertical direction to apply the light in proximity to or in contact with the opposite face of the pattern face of the template 120. Further, the light irradiation unit 404 is configured to be able to adjust the illuminating angle of light to the template 120. On the contrary, the template holding chuck 401 may have means for adjusting the inclination of the template 120 to the illuminating light.

The cleaning apparatus 400 according to the embodiment, or part of the units, may be provided inside the imprint apparatus 100 used for the pattern formation as shown in FIG. 1. In this case, the template holding chuck 104 of the imprint apparatus 100 can function as the template holding chuck 401 of the cleaning apparatus 400.

Subsequently, referring to FIG. 5, a template cleaning method according to the embodiment using this apparatus will be described below. FIG. 5 is a cross-sectional view of a process showing the template cleaning method according to the embodiment.

Figure 5A:
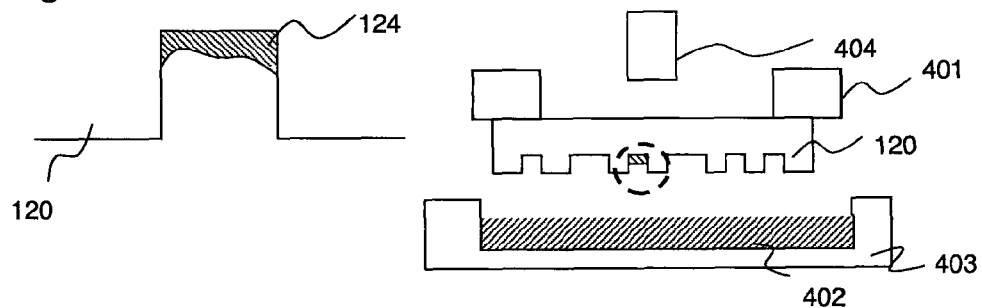
FIG. 5A is a cross-sectional view of a process showing a pattern forming method using the nanoimprint lithography according to the first embodiment of the invention.

First of all, the template holding chuck 401 holds the template 120 so that the concavo-convex pattern face (cleaning face) may be directed to the opposite side of the light irradiation unit 404 and further directed to the cleaning agent supply unit 403 reserving the cleaning agent 402, as shown in the right view of FIG. 5A. The left view of FIG. 5A is an enlarged view of a dotted line part in the right view of FIG. 5A. A resist residue adheres to the pattern face of the template 120, as shown in the left view of FIG. 5A. In the following explanation using FIG. 5, reference is only made to the enlarged view of the part as shown in the left view of FIG. 5A.

Figure 5B:
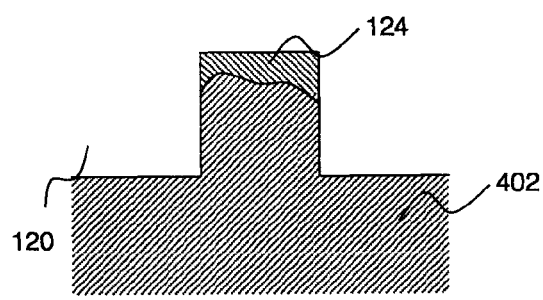
FIG. 5B is a cross-sectional view of a process showing the pattern forming method using the nanoimprint lithography according to the first embodiment of the invention.

Next, the template holding chuck was driven to bring the pattern face of the template 120 containing the resist residue 124 into contact with the cleaning agent (oxygen water) 402 within the cleaning bath to supply the cleaning agent 402 to the pattern face, as shown in FIG. 5B. At this time, it is desirable to soak the template in the cleaning agent 402 to the extent that the cleaning agent 402 may not cover the opposite face of the pattern face of the template 120. The reason is the following; after advancing to a light irradiation process as will be described later, while the cleaning agent 402 is supplied to the opposite face of the pattern face, the light applied from the opposite face of the pattern face is absorbed into the cleaning agent 402 covering the opposite face of the pattern face, so that the light does not reach or reaches very weakly the pattern face, whereby there is a possibility that the cleaning is not performed sufficiently.

Figure 5C:
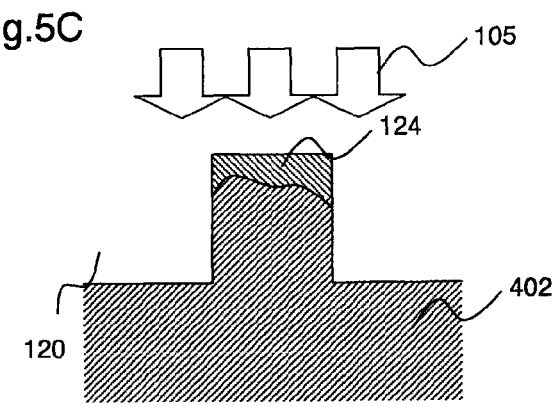
FIG. 5C is a cross-sectional view of a process showing the pattern forming method using the nanoimprint lithography according to the first embodiment of the invention.

Next, the light having a wavelength of 172 nm (excitation light 105) was applied from the opposite face of the concavo-convex pattern face of the template 120 to the pattern face of the template 120, using the light irradiation unit, in a state where the concavo-convex pattern face of the template 120 was soaked, as shown in FIG. 5C. The light having a wavelength of 172 nm is slightly absorbed by quartz of the template base material, but applied to the resist residue 124 and its surrounding cleaning agent 402. In the water excited by the light having a wavelength of 172 nm, the OH radical occurs, and starts the reaction with the resist residue. In the case where water or an aqueous solution as the solvent is employed for the cleaning agent 402, the light having a wavelength of 200 nm or less, without being limitative to the light having a wavelength of 172 nm, can be applied to the cleaning agent to excite the water in the cleaning agent and produce the OH radical. In this embodiment, after the pattern face of the template 120 is soaked in the cleaning agent 402, the light irradiation unit was driven and brought into contact with the opposite face of the pattern face of the template 120 to apply the light in a state where they are contacted. If the illuminating light 105 passes through a medium (air or water vapor) between the light irradiation unit and the template, the light is absorbed into the medium, so that the light does not reach the pattern face fully in some cases. However, if the light is applied from the light irradiation unit in contact with the opposite face of the pattern face of the template in this way, it is possible to prevent the absorption of the light in the medium between the light irradiation unit and the template.

However, when there is no great influence of absorbing the illuminating light in the medium between the light irradiation unit and the template, and the desired quantity of light is reached the pattern face, it is not necessary that the light irradiation unit is placed in contact with the opposite face of the pattern face of the template, and it is sufficient that the light irradiation unit is made proximate to the template. If the absorption of the light having a wavelength of 172 nm is decreased by nitrogen purge, or a near vacuum is formed between the template and the light irradiation unit, it is also sufficient that the light irradiation unit is made proximate to the template.

Also, to suppress the absorption of the illuminating light in the medium between the light irradiation unit and the template, the dry air may be introduced into the space between the light irradiation unit and the template so that water at high light absorption ratio may not be contained in the medium between the light irradiation unit and the template.

Further, though the light is incident vertically upon the template face in FIG. 5C, it is not necessary that the light is incident vertically. The light may be incident obliquely depending on the position of the resist residue within the pattern concave.

Figure 5D:
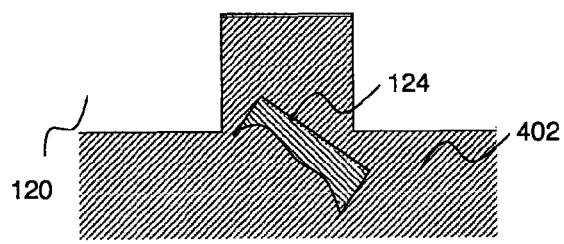
FIG. 5D is a cross-sectional view of a process showing the pattern forming method using the nanoimprint lithography according to the first embodiment of the invention.

Since the surface of the resist residue 124 (contact face with the cleaning agent 402) gradually becomes hydrophilic owing to the OH radical reaction, as shown in FIG. 5D, the cleaning agent permeates on the interface (lateral face of the concave pattern) between the resist residue 124 and the template 120. Moreover, the permeating cleaning agent is excited by the light having a wavelength of 172 nm to enlarge a hydrophilic area of the resist residue 124, and accordingly cause the cleaning agent 402 to percolate on the interface, so that the resist residue 124 is peeled from the template interface. As the reaction progresses, part of the resist residue 124 may become water soluble, and be dissolved in some cases.

Also, oxygen in the cleaning agent 402 is excited by the light having a wavelength of 172 nm to produce an oxygen radical. Since the oxygen radical also acts to decompose the resist residue, an OH radical reaction progresses for the resist residue 24 to have solubility, while an oxidative degradation process owing to the oxygen radical reaction progresses.

Figure 5E:
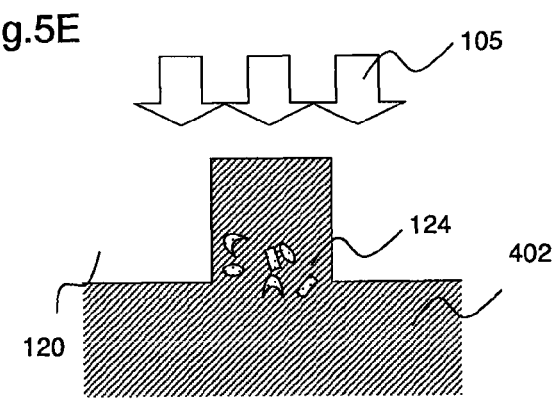
FIG. 5E is a cross-sectional view of a process showing the pattern forming method using the nanoimprint lithography according to the first embodiment of the invention.

While the light 105 having a wavelength of 172 nm is applied to the resist residue 124 peeled from the template 120, as shown in FIG. 5E, the dissolution and the oxidative degradation reaction progress under the action of OH radical produced from water and oxygen radical produced from oxygen.

Figure 5F:
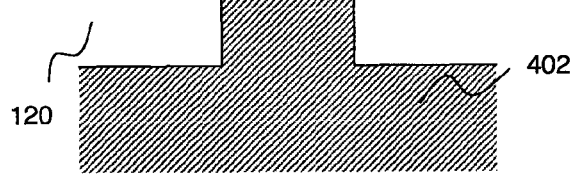
FIG. 5F is a cross-sectional view of a process showing the pattern forming method using the nanoimprint lithography according to the first embodiment of the invention.

Finally, the concavo-convex pattern face of the template 120 was rinsed to remove the suspended matter remaining in the cleaning agent 402, and further substituted into isopropanol and dried, whereby the process was ended, as shown in FIG. 5F. With the cleaning method according to the embodiment, the resist residue occurring on the concavo-convex pattern face of the template could be completely removed.

Though in this embodiment, the oxygen water was employed for the cleaning agent, oxygen or ozone contained in the solvent containing OH such as water or alcohol producing the OH radical owing to light irradiation may be employed. Even in the pure water in contact with the atmosphere, oxygen of about 10 ppm is dissolved, in which the effect could be also confirmed by employing such (pure) water. Though there is an oxidization action with ozone water singly, the resist residue could be more effectively removed by applying the light having a wavelength of 172 nm from the template side as in this embodiment.

However, if the light having a wavelength of 172 nm was applied from the side of the pattern face of the template in a state where the ozone water was supplied to the concavo-convex pattern face of the template, the resist residue could be hardly removed. This is because the ozone water strongly absorbed the light having a wavelength of 172 nm to produce the OH radical on the surface of ozone water to which the light was applied, but not to cause excitation around the resist residue as the light did not reach near the resist residue, so that the radical reaction on the surface of resist residue could not occur.

Though in this embodiment, the cleaning agent was statically supplied, it may be flowed. Since the light for exciting the cleaning agent is applied from the side of the template, it is a feature that the radical reaction with the resist residue occurs on the interface between the template and the resist residue, irrespective of whether the cleaning agent is still or flows. When the cleaning agent is flowed (running water), the peeled and decomposed residue can be effectively removed from the concavo-convex pattern face of the template, whereby the higher cleaning effect can be attained.

Generally, it is well known that if the excimer lamp is directed to the organic substance such as resist in the atmosphere, it directly acts on oxygen to generate excited oxygen atoms, and the organic substance can be decomposed into carbon dioxide and water using them, and removed. However, if the excimer lamp was directed from the side of the pattern face of the template in the atmosphere, it could be confirmed that the organic substance was decomposed because sufficient amount of ozone was supplied on the surface of residue, but the organic substance remained as rather strong residue on the interface between the resist residue and the template, because only a cross linking reaction progresses due to short wavelength irradiation at the early time of light irradiation.

(Second Embodiment)

A template cleaning method according to this embodiment is the method of cleaning the template using an aqueous solution or organic substance with hydrogen peroxide containing ozone and carbon dioxide as the solute, instead of the oxygen water of the cleaning agent used in the cleaning method according to the first embodiment. Since the other parts are substantially the same, the detailed explanation for part of the process is omitted.

When the aqueous solution or organic substance with hydrogen peroxide as the solute is employed for the cleaning agent, the light greatly attenuates in the hydrogen peroxide water, if the light having a wavelength of 172 nm is employed as the excitation light of the cleaning agent as in the first embodiment. Therefore, an excimer lamp of KrCl was employed as the light irradiation unit from an absorption band of wavelength 250 nm or less, and the light (excitation light) having a wavelength of 222 nm was applied to the cleaning agent.

Using the same method as in the first embodiment, this excitation light was applied through the opposite face of the concavo-convex pattern face of the template. One hydrogen peroxide molecular generates two OH radicals, when the light having a wavelength of 222 nm below 250 nm is applied. Therefore, an OH radical reaction can effectively occur on the surface of resist residue, whereby with the cleaning method according to the embodiment, the resist residue could be peeled from the template in about one-half processing time of the cleaning method according to the first embodiment.

A slight amount of carbon dioxide contained in hydrogen peroxide water has a role of controlling the potential so that the resist residue peeled from the template and its oxidative degradation product may not adhere again to the template. Therefore, the resist residue peeled owing to the excitation effect of a slight amount of ozone contained in hydrogen peroxide with the light having a wavelength of 222 nm could be decomposed into water, carbon dioxide and sulfur dioxide efficiently. The resist residue peeled and decomposed owing to the OH radical and ozone oxidation from the template was removed in the pure water, and the template surface was dried, whereby the resist residue removal process was ended.

(Third Embodiment)

A template cleaning method according to this embodiment is the method of cleaning the template using the isopropyl alcohol in which carbon dioxide is dissolved as the cleaning agent, instead of the oxygen water of the cleaning agent used in the cleaning method according to the first embodiment. Since the other parts are substantially the same, the detailed explanation is omitted.

With the template cleaning method according to this embodiment, like the cleaning method according to the first embodiment, the light having a wavelength of 172 nm was applied through the opposite face of the concavo-convex pattern face of the template, using an Xe excimer lamp (light irradiation unit). The isopropyl alcohol in the cleaning agent can absorb the light having a wavelength of 172 nm efficiently.

The isopropyl alcohol near the interface with the template generated the OH radical owing to the excitation reaction caused by applying the light having a wavelength of 172 nm, and the OH radical reacted with the resist residue to peel the resist residue from the template. Part of the resist residue that becomes water soluble owing to the reaction with the OH radical was dissolved in the isopropyl alcohol of the cleaning agent. The peeled and dissolved resist residue was washed away from the concavo-convex pattern face of the template using the isopropyl alcohol. At this time, the peeled matter and dissolved matter of the resist residue could be prevented from adhering again to the template due to carbon dioxide contained in the isopropyl alcohol, as in the cleaning method according to the second embodiment. After rinsing with the isopropyl alcohol, as described above, the template was dried, whereby the cleaning process was ended.

In this embodiment, the isopropyl alcohol was employed for the cleaning agent, but is not limitative. The low molecular weight alcohol having a carbon number of 4 or less such as methanol, ethanol, propanol or butanol could be employed to achieve the same effect.

Also, the OH radical reaction could occur more effectively, employing the cleaning agent in which hydrogen peroxide was dissolved in the alcohol.

Employing the cleaning agent in which oxygen or ozone is dissolved in the above cleaning agent, the peeled resist residue or dissolved matter could be further oxidized and decomposed, whereby the more excellent cleaning effect was obtained.

Though the light having a wavelength of 172 nm was employed in this embodiment, it is not limitative. The light may have any wavelength as far as the light having the wavelength in the light absorption band of the cleaning agent produces the OH radical and transmits through the template material. When alcohol is employed for the cleaning agent, the radical can be generated by employing the light having a wavelength of 250 nm or less, for example.

Fourth Embodiment

With the template cleaning method according to this embodiment, it is possible to effectively remove the resist residue arising on the pattern face of the template. A major difference between the cleaning method according to this embodiment and the cleaning method according to the first embodiment is a method of supplying the cleaning agent to the template. Accordingly, the method of supplying the cleaning agent to the template will be mainly described below with reference to FIG. 6. FIG. 6 is a cross-sectional view of a process of the cleaning method according to this embodiment.

First of all, the template 120 is held in a template cleaning apparatus 500, as shown in the right view of FIG. 6A. In this embodiment, the template 120 is held upward by a template holding chuck 501. In this way, to prevent occurrence of a gap between the resist residue inside the pattern of cleaning object and a supplied cleaning agent 502, it is preferable to turn up the pattern face of the template 120.

In the cleaning apparatus 500 for use in performing the cleaning method according to the embodiment, the cleaning bath is not employed as a cleaning agent supply unit 503, unlike the first embodiment, but a humidity adjustment unit is employed. The humidity adjustment unit adjusts the humidity inside the apparatus 500 by supplying the vaporized or misted cleaning agent 502 into the apparatus 500 to supply the cleaning agent 502 to the pattern face of the template. It is preferable that the humidity adjustment unit is configured to be able to control independently the humidity near the pattern face of the template 120 and the humidity near the opposite face of the pattern face. A light irradiation unit 504 is disposed near the opposite face of the pattern face of the template 120 as in the first embodiment. Also, the atmosphere with humidity adjusted is controlled so as not to turn in between the template 120 and the light irradiation unit 504.

The left view of FIG. 6A is an enlarged view of a dotted line part of the right view of FIG. 6A. In the following explanation using FIG. 6, reference is only made to the enlarged view similar to the left view of FIG. 6A.

After the template 120 on which the resist residue 124 occurs was exposed to the atmosphere at room temperature and with a humidity of 45% employing the humidity adjustment unit, the template 120 was cooled to make dew drops of the cleaning agent 502 on the surface of the template 120 and the surface of the resist residue 124, as shown in FIG. 6B.

As described above, the method for supplying the cleaning agent 502 to the pattern face of the template 120 owing to dew condensation is easily realized in such a way that the atmosphere of saturated humidity is formed at the first temperature by the cleaning agent supply unit (humidity adjustment unit), and the atmosphere is placed into contact with the pattern face (cleaning face) of the template 120 at the lower temperature than the first temperature.

With this method, when the functional water is employed as the cleaning agent 502, oxygen, ozone or hydrogen peroxide can be brought into contact with the dew condensation water and dissolved in the dew condensation water to produce the adsorbed oxygen water, ozone water, or hydrogen peroxide water.

In the light irradiation process according to this embodiment, like each embodiment as described above, it is desirable to apply the light from the opposite face of the pattern face of the template 120 in a state where the light irradiation unit is placed in contact with the opposite face of the pattern face of the template 120.

Also, if the light is applied without contact between the light irradiation unit and the template 120, it is necessary to suppress the absorption of illuminating light in an optical path medium from the light irradiation unit to the opposite face of the pattern face of the template. More specifically, it is desirable to reduce the water content of the atmosphere near the opposite face of the pattern face of the template using the humidity adjustment unit, and prevent condensation of dew on the opposite face of the pattern face. For example, it is possible to suppress condensation of dew by heating near the opposite face of the pattern face of the template or keeping it in a dry state.

Next, the light 105 having a wavelength of 172 nm was applied from the opposite face of the pattern face of the template 120, employing the light irradiation unit having the Xe excimer lamp, as shown in FIG. 6C. Though the light having a wavelength of 172 nm is slightly absorbed by quartz of the template base material, it is applied to the resist residue and its surrounding dew concentration water. The OH radical occurs in the dew water 502 excited by the light irradiation, and the OH radical starts the reaction with the resist residue 124.

Since the surface of the resist residue 124 gradually becomes hydrophilic owing to the OH radical reaction, the dew condensation progresses on the interface between the resist residue 124 and the template 120, and further the dew concentration water condensed on the interface is excited by the light. This reaction is repeated, so that the resist residue 124 is peeled from the template interface. On the other hand, oxygen in the atmosphere is also excited by the light having a wavelength of 172 nm to generate the oxygen radical. This oxygen radical also acts on the resist residue so that the oxidative degradation process progresses.

While the light having a wavelength of 172 nm is applied to the resist residue 124 peeled from the template 120, the dissolution and the oxidative degradation process further progress under the action of the OH radical produced from the water in the cleaning agent 502 and the oxygen radical produced from the oxygen, and finally the resist residue is completely decomposed into water, carbon dioxide and sulfur dioxide, as shown in FIG. 6D.

Finally, the cleaning was completed by elevating the temperature of the template 120 to vaporize the dew concentration water 502, as shown in FIG. 6E. If the hydrophilization (OH) and the decomposition with the cleaning agent 502 excited by this method sufficiently progress, and the vapor pressure of the reaction product between the cleaning agent 502 and the resist residue 124 is sufficiently high, the cleaning agent 502 and the reaction product can be easily vaporized only by elevating the temperature of the template 120, whereby the cleaning in the dry state is allowed.

If the water mark (Water-mark) occurs in the process of vaporizing the dew concentration water owing to the elevated temperature of the template, a water cleaning process may be added, and the water cleaning process may be performed from a low temperature state to effect the drying. Also, isopropyl alcohol may be employed for drying.

For the template with the cleaning agent condensed as in this embodiment, if the excitation light is applied from the pattern face after dew condensation by the method as disclosed in patent document 3 or 4, the decomposition reaction progresses owing to the OH radical and the oxygen radical from the surface of resist residue, but the decomposition reaction is only in the direction from the surface of resist residue, whereby it took twice or more of the cleaning time of the cleaning method according to this embodiment.

By analysis, it could be found that with the cleaning method according to the embodiment, the light was applied through the opposite face of the pattern face of the template, whereby the permeation and decomposition of water were effectively performed on the interface between the template and the resist residue, and the light transmitting through the residue accelerated the OH radical reaction and the oxygen radical reaction on the residue surface, whereby the time gain could be obtained.

With the cleaning method according to this embodiment as described above, the cleaning agent is supplied by condensing water dew on the pattern face of the template of cleaning object, but other cleaning agent supply methods are conceivable. For example, the cleaning agent may be bubbled by the cleaning agent supply unit to the template held with the pattern face directed up, and the cleaning agent supplied in a mist state without condensing water dew on the pattern face (cleaning face) of the template.

To employ the functional water with this method, the desired oxygen water, ozone water and hydrogen peroxide water can be supplied to the cleaning face by appropriately setting the oxygen concentration, ozone concentration, and hydrogen peroxide concentration in the gas to be bubbled.

If the hydrophilic treatment with OH radical and the decomposition with the cleaning agent excited by this method sufficiently progress so that the matter of high vapor pressure can be obtained as the reaction product between the cleaning agent and the contamination, the cleaning agent and the reaction product can be easily vaporized only by elevating the temperature of the template, whereby the cleaning in the dry state is allowed.

Also in the light irradiation process of the template cleaning method using this cleaning agent supply method, it is desirable to apply the light from the opposite face of the pattern face of the template in a state where the light irradiation unit is kept in contact with the opposite face of the pattern face of the template.

Also, if the light is applied without contact between the light irradiation unit and the template, it is necessary to suppress the absorption of light in the medium from the light irradiation unit to the opposite face of the pattern face of the template. More specifically, it is desirable to prevent supply of the cleaning agent to the neighborhood of the opposite face of the pattern face of the template. For example, it is necessary to supply the mist-like cleaning agent to only the pattern face (cleaning face) of the template.

The cleaning method according to each embodiment as described above is not limited to cleaning the template for use with the imprint lithography that makes photo exposure, but may be applied to the template for use in the imprint with thermosetting without using the light in the same way, as far as the template material is a member capable of transmitting the light required to produce the OH radical such as synthetic quartz or sapphire.

Though in each embodiment as described above, the resist residue arising on the pattern face of the template is a removal object, the removal object is not limited to the resist residue. With the same method, the organic substance adhering to the template may be the cleaning object.

Employing the template cleaned by the cleaning method according to each embodiment as described above, it is possible to produce the resist pattern without common defect by forming the resist pattern on the semiconductor substrate by the method as shown in FIG. 2, whereby the semiconductor device can be manufactured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of cleaning a template comprising:
    holding a quartz template having:
        a concavo-convex pattern face having contamination at a contamination area; and
        a back face;
    supplying a cleaning agent in the form of vapor or mist to the contamination area while maintaining the back face free of the cleaning agent;
    controlling the humidity so as to assist with formations of dew drops of the cleaning agent on the pattern face and on the surface of the contamination area;
    optically exciting the cleaning agent by applying emitted light having a wavelength of 250 nm or less to the contamination area from a light irradiation unit in direct contact with the back face so as to reduce absorption of the emitted light, such that:
        the optical excitation of the cleaning agent produces a radical at an interface between the contamination and the template;
        the contamination is made hydrophilic by reaction of the contamination with the radical; and
    peeling the contamination from the template.

2. The method of cleaning a template according to claim 1, wherein the cleaning agent causing said radical is water.

3. The method of cleaning a template according to claim 1, wherein the cleaning agent causing said radical is an aqueous solution with water as the solvent.

4. The method of cleaning a template according to claim 1, wherein the cleaning agent causing said radical is an aqueous solution with hydrogen peroxide as a solute.

5. The method of cleaning a template according to claim 1, wherein the cleaning agent causing said radical is an organic substance.

6. The method of cleaning a template according to claim 1, wherein the cleaning agent causing said radical is an alcohol.

7. The method of cleaning a template according to claim 1, wherein oxygen as a solute is contained in the cleaning agent.

8. The method of cleaning a template according to claim 1, wherein ozone as a solute is contained in the cleaning agent.

9. The method of cleaning a template according to claim 7, further comprising decomposing said hydrophilic contamination using optically excited oxygen.

10. The method of cleaning a template according to claim 8, further comprising decomposing said hydrophilic contamination using optically excited ozone.

11. The method of cleaning a template according to claim 1, wherein the radical is OH radical.

12. The method of cleaning a template according to claim 7, wherein the emitted light applied to the contamination area has a wavelength of 200 nm or less.

13. The method of cleaning a template according to claim 1, wherein the contamination is resist residue.

14. The method of cleaning a template according to claim 1, wherein the contamination area where said emitted light is applied includes a boundary among a surface of said template, a surface of contamination, and a surface of the cleaning agent.

15. The method of cleaning a template according to claim 1, wherein after the making the contamination hydrophilic by reaction of said contamination with said radical, the cleaning agent permeates the contamination and the permeating cleaning agent is optically excited with the emitted light to produce the radical.

* * * * *